(12) United States Patent
La

(10) Patent No.: US 6,301,401 B1
(45) Date of Patent: Oct. 9, 2001

(54) ELECTRO-OPTICAL PACKAGE FOR REDUCING PARASITIC EFFECTS

(75) Inventor: Hoang-Phong La, Ridgefield Park, NJ (US)

(73) Assignee: Convergence Technologies, Ltd., Kowloon (HK)

( * ) Notice: Subject to any disclaimer, the term of this patent is extended or adjusted under 35 U.S.C. 154(b) by 0 days.

(21) Appl. No.: 09/516,744

(22) Filed: Mar. 1, 2000

Related U.S. Application Data

(60) Provisional application No. 60/127,670, filed on Apr. 2, 1999.

(51) Int. Cl.[7] .................................................. G02B 6/12
(52) U.S. Cl. ................................................ 385/14; 385/88
(58) Field of Search ................................. 385/14, 88–94

(56) References Cited

U.S. PATENT DOCUMENTS

| | | | |
|---|---|---|---|
| 4,373,778 | 2/1983 | Adham | 385/14 |
| 4,862,231 | 8/1989 | Abend | 357/19 |
| 4,930,857 | 6/1990 | Acarlar | 385/14 |
| 5,195,154 | * 3/1993 | Uchida | 385/88 |
| 5,249,245 | 9/1993 | Lebby et al. | 385/89 |
| 5,359,208 | 10/1994 | Katsuki | 257/82 |
| 5,362,976 | 11/1994 | Suzuki | 257/81 |
| 5,371,820 | 12/1994 | Welbourn | 385/76 |
| 5,384,873 | 1/1995 | Chun et al. | 385/31 |
| 5,489,798 | 2/1996 | Doguchi et al. | 257/458 |
| 5,638,469 | 6/1997 | Feldman | 385/14 |
| 5,747,363 | 5/1998 | Wei et al. | 438/5 |
| 5,821,571 | 10/1998 | Lebby et al. | 257/98 |

FOREIGN PATENT DOCUMENTS

| | | |
|---|---|---|
| 0 630 057 A2 | 12/1994 | (EP) . |
| 2 322 479 A | 8/1998 | (GB) . |
| WO 99/13515 | 3/1999 | (WO) . |

OTHER PUBLICATIONS

International Search Report, dated Sep. 8, 2000 for PCT Application No. PCT/US00/08463.
Lieberman, "Hybrid Board Scheme Bridges Optical and Electrical Circuitry", Computer Design, vol. 27, No. 19, Oct. 15, 1988, pp. 38, 40–41.

* cited by examiner

*Primary Examiner*—Phan T. H. Palmer
(74) *Attorney, Agent, or Firm*—Fish & Richardson P.C.

(57) ABSTRACT

An electro-optical package insertable into a motherboard of an electronic component permits the package to receive electrical and/or optical signals from the motherboard, converts the electrical signals into optical signals and transmit the optical signals within the package, and emits the optical signals from the package and/or convert the optical signals back into electrical signals for emission from the package. Such a package includes at least one substrate; at least one integrated circuit die, disposed directly or indirectly on the substrate; at least one electricity-to-light converter operatively connected to the integrated circuit die to receive electrical signals from the integrated circuit die and convert the electrical signals into optical signals; and at least one optical guide constructed and arranged to receive optical signals from the converter and transmit the optical signals either outside of the package as optical signals or to a light-to-electricity converter optionally provided in the package. The integrated circuit die, the electricity-to-light converter, and at least a portion of the optical guide are encapsulated within a resin or cured resin.

36 Claims, 7 Drawing Sheets

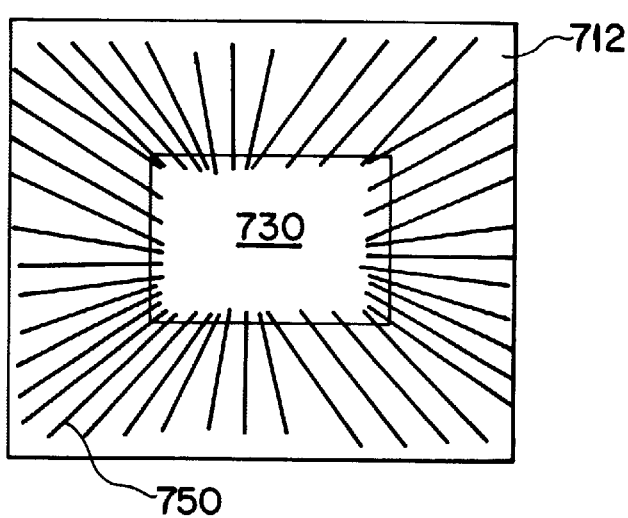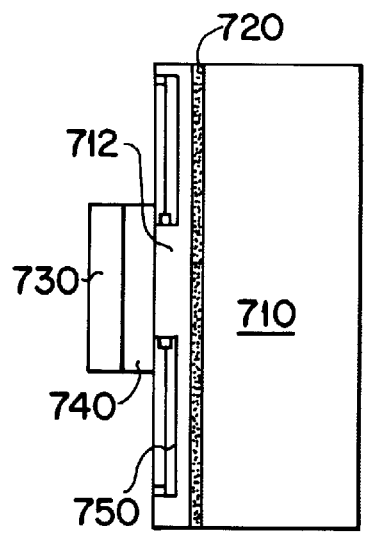
FIG. 7A   FIG. 7B
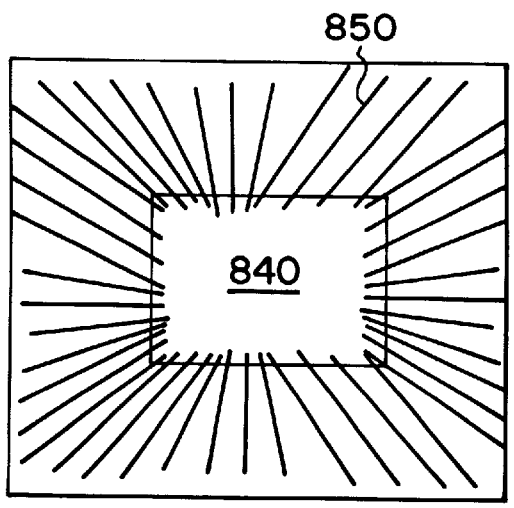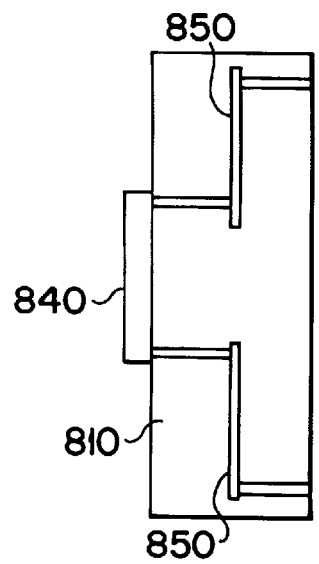
FIG. 8A   FIG. 8B

ELECTRO-OPTICAL PACKAGE FOR REDUCING PARASITIC EFFECTS

This application claims the benefit of U.S. Provisional Application No. 60/127,670, filed Apr. 2, 1999.

BACKGROUND OF THE INVENTION

1. Field of the Invention

The present invention relates to electronic packages, used in a wide variety of applications, including, by way of example, packages that perform signal processing or signal conversions and complex timing control.

2. Description of the Related Art

An electronic package is a package which houses one or more integrated circuits (ICs). Electronic packages both protect ICs thereof by encasing the ICs in a protective resin and simplify handling of ICs. ICs perform various functions, which include, for example, processing data.

Currently, a common application of electronic packages is the routing of signals through electrical conductors. Due to advances in the sophistication and miniaturization of electronic devices, there is a demand to increase the number of input and output signals and decrease package size. As a consequence, the signal traces become smaller and the pitch of the traces, i.e., the distance separating the signals, becomes smaller. By having a smaller pitch, more signal traces can be included in a package. The manufacturability of such fine pitch circuitry is limited. Currently, the finest pitch circuitry is formed by chemical etching processes, which inherently place physical limitations on the ability to decrease the attainable pitch size and signal trace size to a desired level. Also, as the pitch and traces become smaller, parasitic effects arising from mutual capacitance and inductance become a serious hindrance to the operation speed of the packages.

The parasitic effects inherent from circuit layout patterns are typically accounted for in the design stage, during which many man-hours and much know-how must be dedicated to alter the patterns of the tracings. Often, the target speed of a package cannot be obtained at a desired size, and thus, a larger package size is required. Another approach for minimizing parasitic effects is to separate the signal traces from one plane to multiple planes, thereby alleviating the requirements on the size of the pitch and trace.

Additional problems associated with current electronic packages stem from the wire-bonding process, which is a fairly well known and accepted process in the industry. The wire-bonding process disadvantageously restricts the configuration of the input and output (I/0) pads on the die. For example, because gold wire contacts can short each other out, the I/O pads must typically line up precisely along the perimeter of the die. Further, compared to an area arrayed with I/O pads, the peripheral configuration of wire-bonded pads has a lower I/O density for a die greater than a certain critical size. Due to these restrictions, the flip chip process, which is capable of processing a die with an area array of I/O pads, has become increasingly important. However, successful practice of the flip-chip process requires significant capital re-investment and extensive training. Still another drawback is that current electronic packages communicate electrically. As a consequence, communications between such units impose tracing requirements on the PCB board. Such requirements also involve similar parasitic effects, and are cumbersome to implement. For example, a board containing 20 packages with each package having 300 I/Os that communicate with each other would require an extremely large number of circuit tracings.

Several proposals have been made to overcome these problems. For example, in U.S. Pat. No. 4,930,857 to Acarlar, an arrangement that accommodates electronic and optical components is disclosed. A multi-layer ceramic component sub-assembly provides an improved EMI and mechanical protection. A method to house different components is also disclosed. However, Arcarlar addresses only improved hermeticity. Other U.S. patents discuss methods to integrate optical circuitry and parts. For example, U.S. Pat. No. 5,249,245 to Lebby et al. discusses interconnecting optical electronic components, waveguides, and electronic components. U.S. Pat. Nos. 5,747,363 to Wei et al. and 5,821,571 to Lebby et al. disclose methods of integrating the electronic driver circuitry with an LED array or a dual-sided light emitting diode (LED and laser) with the driver circuitry. Other references discuss use of tapered surfaces to align optical waveguides to light-emitting surfaces and production of a monolithically integrated device consisting of the optical device and an electronic device.

However, none of the above-discussed techniques were intended for or proven to be successful in minimizing parasitic effects during communications within and between electronic packages. For example, U.S. Pat. No. 5,195,154 to Uchida discusses a technique to mount and align optical components on a board is disclosed. However, there is no discussion about using optical technology to alleviate parasitic effects.

SUMMARY OF THE INVENTION

It is, therefore, an object of this invention to provide a package that overcomes the above-discussed problems.

In accordance with the principles of this invention, this and other objects are attained by providing an electro-optical package insertable into a motherboard of an electronic component to permit the package to receive electrical and/or optical signals from the motherboard and emit electrical and/or optical signals therefrom. The package comprises a substrate having disposed thereon and directly or indirectly attached or interconnected thereto at least one integrated circuit die, at least one electricity-to-light converter operatively connected to the integrated circuit die to transmit electrical signals from/to the integrated circuit die and convert the electrical signals into optical signals, and at least one optical guide. The optical guide is constructed and arranged to transmit optical signals from/to the converter and transmit the optical signals either outside of the package as optical signals or to/from a light-to-electricity converter optionally provided in or outside of the package. The integrated circuit die, the electricity-to-light converter, and at least a portion of the optical guide are encapsulated within a resin or cured resin.

By sending coming signals to/from the integrated circuit die as light instead of electricity, the current invention largely circumvents the problems of parasitic effects associated with electrical signals. Also, this invention permits manufacturing with dies having area-arrayed I/O pads as the optical waveguiding fibers. The area-arrayed I/O pads can contact each other without shorting. Furthermore, the present invention has the potential of allowing manufacturers to retro-fit existing wire-bonders without requiring additional re-investment in a flip-chip bonder and extensive training. The present invention is compatible with current electronic products as well as future generations of electronic products, such as when the PCB boards are replaced by light-guiding boards. By replacing the electrically-conducting PCB boards with a light-guiding board or an optical board, the tracing requirements are substantially reduced.

These and other objects, features, and advantages of this invention will become more apparent from the following detailed description and accompanying drawings, which illustrate, by way of example, the principles of this invention.

BRIEF DESCRIPTION OF THE DRAWINGS

The principles of this invention will now be elucidated upon by reference to the embodiments depicted in the attached drawings, in which:

FIGS. 7A, 7B, 8A, and 8B show examples of light guiding media;

DETAILED DESCRIPTION OF THE INVENTION

Figure 1A:
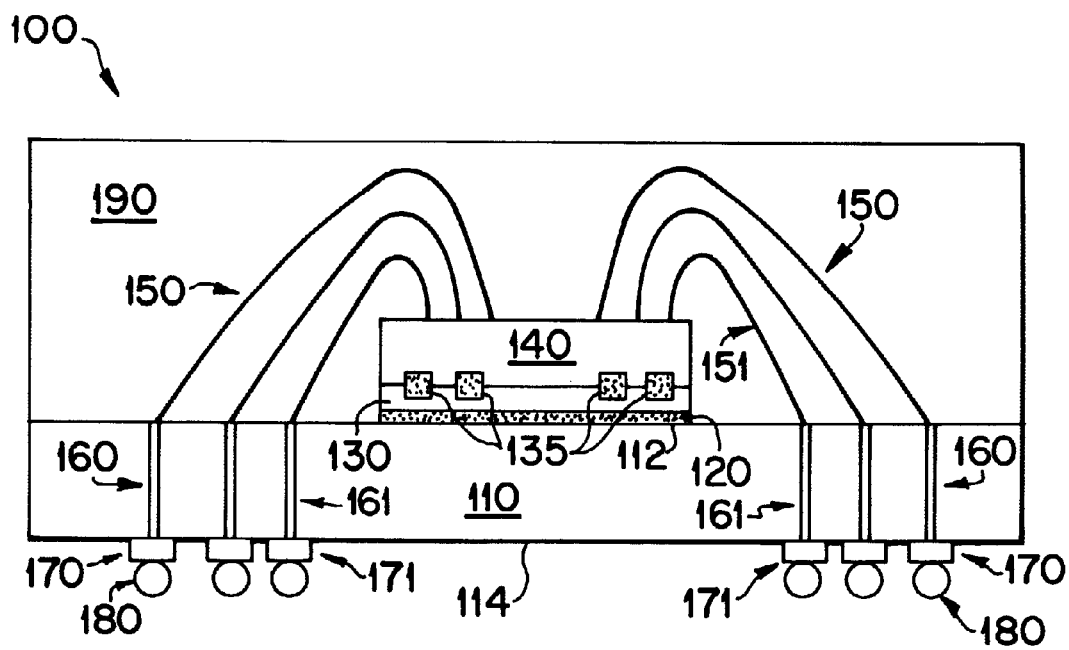
FIGS. 1A and 1B are schematic side/end (the package is symmetrical) and top views, respectively, of an electro-optic (EO) package according to a first embodiment of the present invention.

An electro-optic package in accordance with a first embodiment of the present invention will now be explained in greater detail with reference to FIGS. 1A and 1B. In these figures, an electro-optic package is generally designated by reference numeral 100. The package 100 includes substrate 110, which serves as a base on which other components of the EO package are disposed. The substrate 110 can be formed, for example, of resin in various forms, such as BT, ceramic, or metal.

The substrate 110 has an adhesive 120 disposed on a surface region 112 thereof for securing an IC die 130 to the substrate 110. On top of the IC die 130, an electricity-to-light converter 140 is disposed. Between the IC die 130 and the electricity-to-light converter 140 are bondpads 135. Extending from the converter 140 are optical guides 150, each of which is an optical fiber that can contact another light guiding material portion 150, or can have a fiber portion 160 of the guides 150 passing through a through-hole in the substrate 110. Light-to-electricity converters 170 can be disposed either on top of or in small cavities formed on a bottom surface 114 of the substrate 110. An optically transparent adhesive (not shown) can be used between the converter 170 and the surface 114 to secure the converter 170 to the surface 114. A soldermask (not shown) of any suitable polymer can be used to coat surface 114 and portions of converter 170. For each light-to-electricity converter 170, there is a corresponding electrical conductor 180 formed on the non-soldermask covered area. The electrical conductors 180 can be, by way of example and as illustrated, solder spheres, although other conductors such as gold, nickel, copper, or an alloy, can also be used. Resin 190, usually in a cured state encapsulates the optical guides 150, the IC die 130, and the primary electricity-to-light converter 140, and covers the upper surface of substrate 110. These resins are well-known and can be glob-top compounds, transfer molding materials, or the like.

A separate path for power and ground to the electro-optic package 100. For example, power and ground are provided along the path, 180 - 171 - 161 - 151. The converter 140 receives these signals and simultaneously passes the signals to the integrated circuit die 130. Other signals are either generated at the die and sent outward or are generated external to the package, and subsequently enter the package 100. Signals that are generated at the IC die 130 are transmitted to the converter 140, which converts the electrical signals to optical signals. The optical signals leave the converter 140 via optical waveguides 150 and 160. The optical signal arrives at the converter 170, which converts the signal into electricity, and is conducted away by the conductor 180. For electrical signals incoming to the converter 170 through the conductor 180, the process is essentially reversed. That is, the electrical signal is converted into an optical signal which is then guided through the waveguides 150 and 160 to arrive at the converter 140. The converter then converts the optical signal into an electrical signal which is then conducted to the integrated circuit die 130.

Figure 2A:
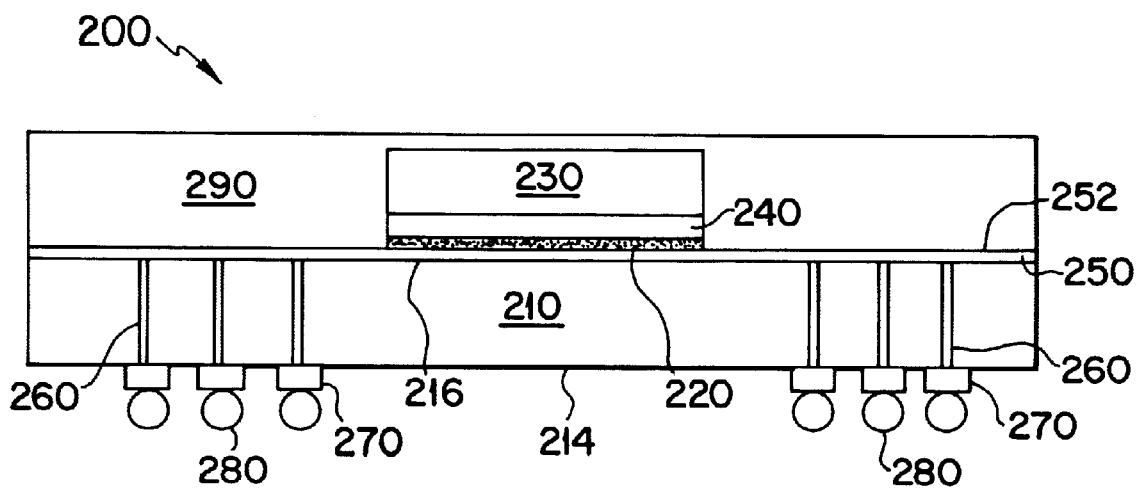
FIGS. 2A and 2B: are schematic side/end (the package is symmetrical) and top views, respectively, of an electro-optic (EO) package according to a second embodiment of the present invention.
Figure 2B:
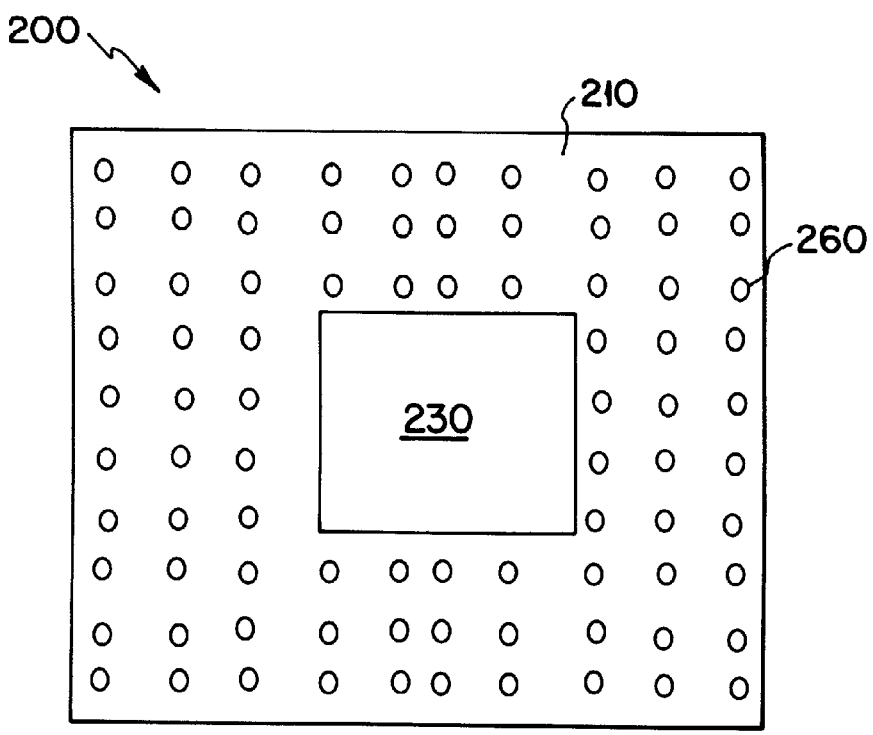

An electro-optic package according to a second embodiment of the present invention will now be explained in greater detail with reference to FIGS. 2A and 2B (FIG. 2B is an exposed view not showing the molding material 290 or light guiding medium 250). In these figures, an electro-optic package is generally designated by reference numeral 200. The package 200 includes a substrate 210, which serves as a base on which other components of the EO package are disposed. The substrate 210 can be formed of the same materials mentioned above in connection with the first embodiment.

The substrate 210 has a light guiding medium 250 disposed on an upper surface 216 thereof. The light guiding medium 250 extends along the length of the upper surface 216 of the substrate 210. An adhesive 220 is disposed on a surface region 252 of the light guiding medium 250 for securing an electricity-to-light converter 240 thereon. The light guiding medium 250 can have several forms, such as a multi-layer structure formed by a thin polymer film, for example, polyimide, an adhesive layer (not shown) on its lower surface, and a light-guiding material on top. This light-guiding material can be optical waveguides layered on top of or embedded within the polymer film. These waveguides could be any of the light-guiding materials, including, but not limited to, optical fibers, air channels with a reflective coating, or any combination thereof. Disposed on top of the converter 240 is an IC die 230. Light guides 260 pass through the substrate 210 to the light-to-electricity converters 270, which are connected to electrical conductors 280. In the first embodiment, light-to-electricity converters 270 are disposed along a bottom surface 214 of the substrate 210. A soldermask (not shown) may be present in which case the electrical conductors 280 would be attached to the non-soldermask covered portion of the converters 270. For each light-to-electricity converter 270, there is a corresponding electrical conductor 280. As in the first embodiment, the electrical conductors 280 can be, by way of example, solder spheres, although other conductors can be used. Cured resin 290 encapsulates the IC die 230, the electricity-to-light converter 240 as well as the upper surface 252 of the light guiding medium 250.

Figure 1B:
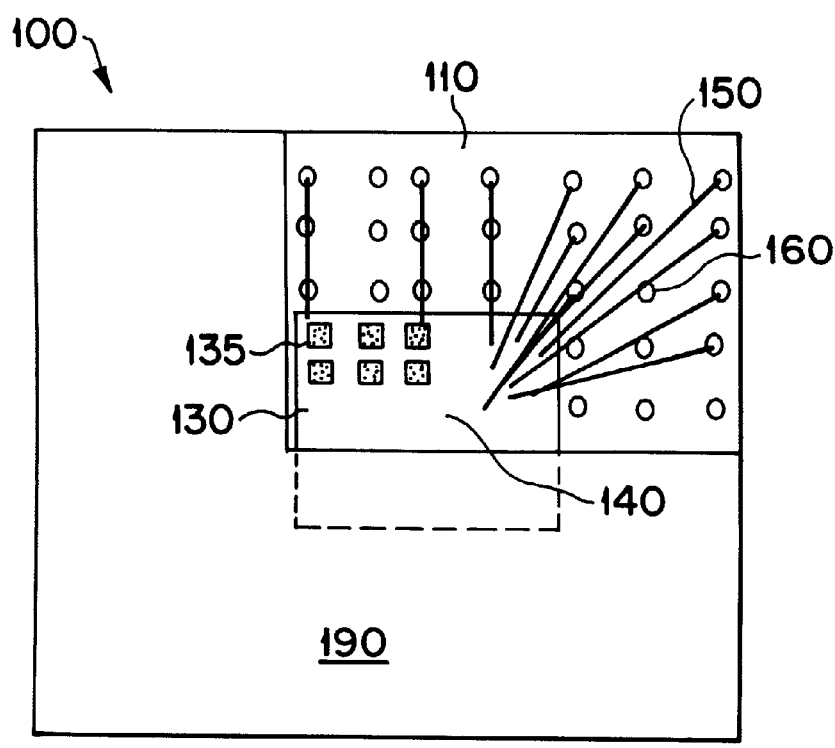

Unlike the embodiment depicted in FIGS. 1A and 1B, in the second embodiment depicted in FIGS. 2A and 2B, the optical guide is the light guiding medium 250. Instead of optical fibers in FIGS. 1A and 1B, the IC die 230 is disposed on top of the primary electricity-to-light converter 240, whereas in FIGS. 1A and 1B, the converter 140 is disposed on top of the IC die 130.

Generally, different bondpads 135 of the integrated circuit die 130 will either generate or receive electrical signals. An outgoing signal is one that is generated by the integrated circuit die 130 and sent outward via selected bondpads 135. This signal reaches the converter 140, 240, which converts the electrical signals into optical signals, which are then transmitted through the optical waveguides either directly to the outside, or the converter 170, 270, which converts the optical signals into electrical signals and are conducted outward through the conductors 180, 280. For the integrated circuit die to operate, incoming signals, power and ground are also required. The incoming signals, which could include timing signals, data from various processors, and data from various memory units, follow the reverse path described above, while the power and ground directly reach the integrated circuit die 130 through the path 180-171-161-151. Due to the existence and conversion of both electrical and optical signals within the package, the package is referred herein as an electro-optic package or an EO package.

As some of the signals must enter the EO package while others must exit, converters 170, 270 at certain locations convert optical signals into electrical signals (light-to-electricity converter), while converters at other locations convert electrical signals into optical signals (electricity-to-light converter). As most converters can only efficiently operate in only one direction, this poses a manufacturing issue, since the assembler must selectively distinguish among the light-to-electricity converters and the electricity-to-light converters and place them appropriately among what could be as many as 400 I/O sites. In the absence of high efficiency, reversible converters, the present invention preferably uses wafer fabrication techniques to produce both the light-to-electricity and electricity-to-light converters, next to each other, so that the resulting dual-converter could be indiscriminately used as converters 170, 270.

As some of the signals must exit the EO package, they could exit either as optical signals or as electrical signals, depending on the compatibility requirement of EO package. For example, in case in which the EO package is to be mounted onto a standard PCB board and to interact with other electronic packages such as Dual-In-Line (DIP), Quad-Flat-Pack (QFP) and Ball-Grid-Array (BGA), the signal can be appropriately converted by converter 170, 270 so that the input and the output of the EO package remains as electrical signals.

For integration purposes, the converter is preferably a semiconductor device. Representative devices of an electricity-to-light converter include a light emitting diode (LED) or a laser diode, which is capable of producing coherent light. Semiconductor devices that produce electricity from light typically belong to the photodiode family. Two common examples are the p-i-n diode and an Avalanche photodiode.

The EO package can also be situated to interact with other similar packages by mounting all such packages onto an optical board in which the exiting signals are optical signals. The optical board permits the packages to optically interact, rand thus: reduces the necessity of routing copper traces onto the optical board. Signals entering or leaving the optical board can either remain in the form of light or can be converted into electricity, depending on compatibility requirements and the intended application. For example, if the optical board is to be mounted onto an electric motherboard, then the optical signals transmitted from the electricity-to-light converters are converted into electrical signals before or upon exiting the optical board, as shown in FIG. 3.

Figure 3:
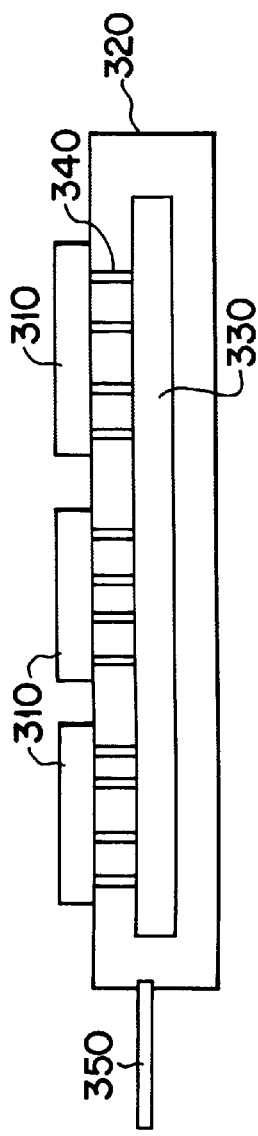
FIG. 3 shows an optical board according to the present invention.

FIG. 3 shows an optical board 320, mountable on a motherboard (not shown). To permit the motherboard and the optical board 320 to communicate, the optical signals from the optical board 320 are converted into electrical signals. The optical board 320 has a light guiding medium 330 disposed thereon. From the light guiding medium 330, other light guiding media 340 channel the optical signals to the opto-electronic packages 310 where the optical signals are converted to electrical signals. Edge connector 350 may transmit electrical or optical signals. In this instance, the edge connector 350 transmits electrical signals, since the contemplated motherboard uses electrical signals.

An edge connector is used to connect the optical board to a motherboard. The edge connector has electrical traces and optical waveguides. The electrical traces and optical waveguides may or may not be combined as one component. The sockets for the edge connector also have electrical contacts for the electrical traces and the appropriate entry points for the optical signals. The entry points for the optical signals may be an optically-reflecting aperture which leads to one optical waveguide of which the optically-reflecting material can also be electrically conducting or the entry points could be openings into a large optically-reflecting cavity in the motherboard.

The EO packages can be mounted onto regular electrically-conducting PCB boards through solder or conductive adhesives, or can be mounted onto an optical board. The optical board has an optical guiding medium integrated on its surface, and can also have electrical traces. Thus, the optical board can accommodate both EO packages and standard electrically-based packages. The optical guiding medium may simply be an air-channel and an optically reflecting medium or optically guiding material, such as an optical fiber. Furthermore, the optical guiding medium can be traces that connect specific bondpads together or a large cavity, as shown in FIGS. 10a and 10b, respectively.

Figure 10A:
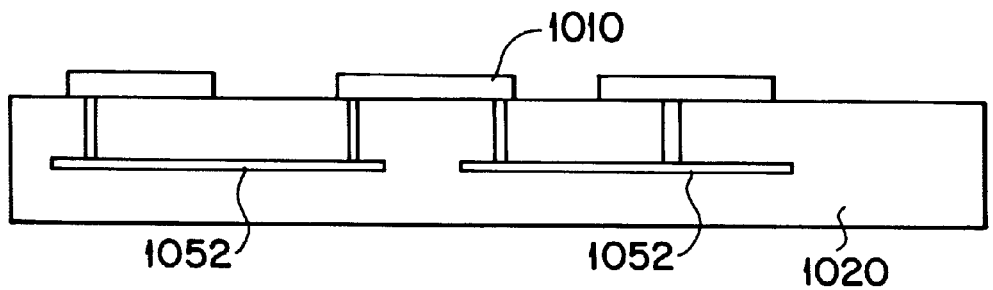
FIGS. 10a and 10b show examples of optical-guiding media as traces and a large cavity, respectively.
Figure 10B:
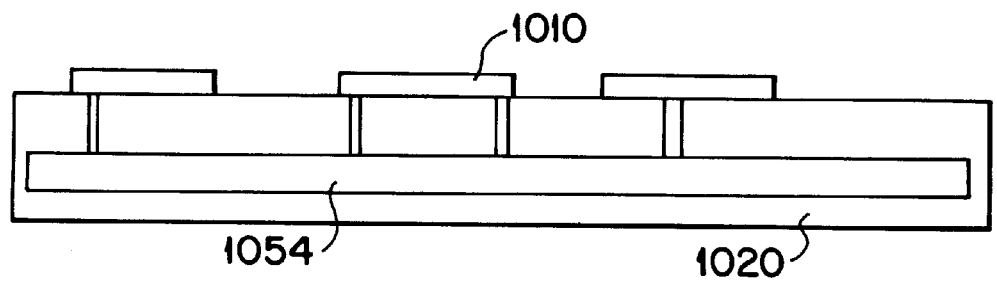

FIGS. 10A and 10B show two variations of the optical guiding medium. In FIG. 10A, the optical guiding medium is formed by a series of traces 1052 that connect specific bondpads together. In Figure 10B, the optical guiding medium is formed by a large cavity 1054. The large cavity may simply be a gas filled cavity, or filled with a suitably transparent polymer. The boundaries of the cavity are-made reflective by an appropriate coating process. Such coating process may be chemical, mechanical, or electrical. The shape of the cavity can be rectangular, ellipsoidal, or irregular.

Figure 4:
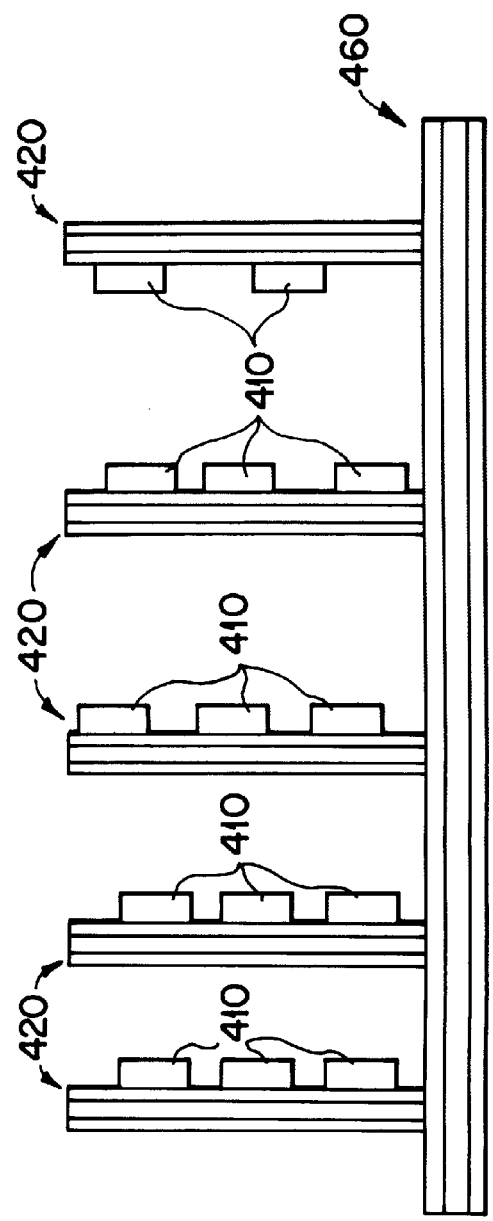
FIG. 4 shows a light-guiding motherboard.

In FIG. 4, an optical motherboard or light-guiding board 460 to which a plurality of optical boards 420 are attached is shown. Each of the optical boards 420 has a plurality of EO packages 410. In FIG. 4, since there are no electrical boards, the motherboard 460 is formed as a light-guiding board.

Thus, the scale of optical interactions can be extended to include a wide variety of electronic assemblies or groups thereof within an enclosure, compartment, or container. Ultimately, this invention would more effectively use the advantages of optical fiber networks that have been used for LAN or long-distance communications to date.

Figure 5:
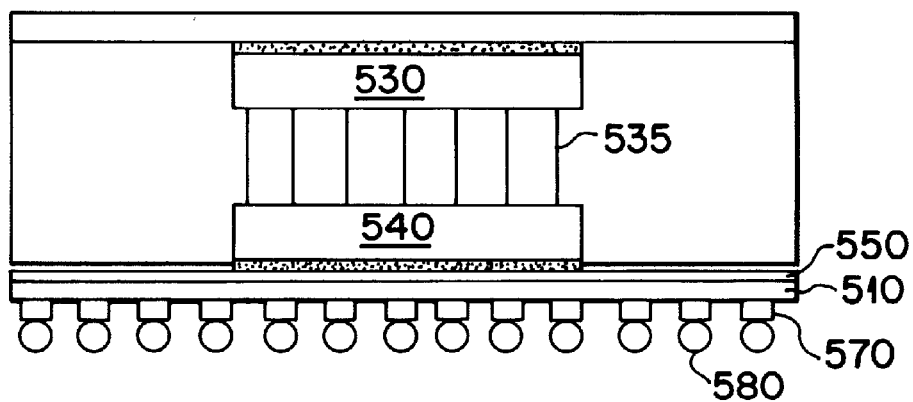
FIG. 5 shows an example of electrical conduction of signals.

The die can be fabricated with the necessary converters integrated. Alternatively, the converter can be fabricated separately and then bonded to the IC die during assembly of the EO package with, for example, electrically conducting bumps. The converter can be disposed either on top of the IC die, as shown in FIG. 1A, or below the IC die, as shown in FIG. 2A. Alternatively, this converter can be spaced away from the IC die to account for heat considerations, as shown in FIG. 5. In this case, electrically conducting wires 535 transmit electrical signals between IC die 530 and the converter 540. If light-to-electricity converters are used 170, 270, or 570, then the light-to-electricity converters are preferably disposed in as close proximity to the conductors 180, 280, 580 of the package as possible to reduce the parasitic effects on the subsequent electrical signals.

Figure 6:
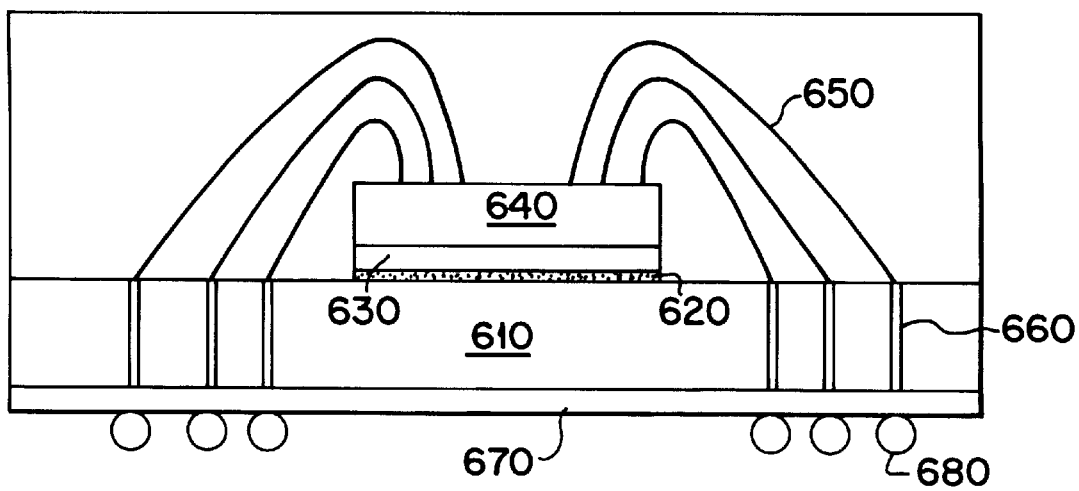
FIG. 6 shows an example of light-to-electricity converters assembled on one die.

Thus far, the light-to-electricity converters have been depicted as assembled onto the package as individual units or as groups. In accordance with another embodiment of this invention illustrated in FIG. 6, the light-to-electricity converters 670 are assembled as one unit, rather than a plurality of individual light-to-electricity converters.

A light-to-electricity converter may be required depending on the compatibility requirements of the optical board. If a light-to-electricity converter is required, the light-to-electricity converter can be embedded within the optical board or can be replaced by a converter package, which is mounted onto the board. The purpose of the light-to-electricity converter is to convert the optical signal into an electrical signal so that it can be routed out to a motherboard.

There are many variations encompassed by the present invention. For example, the numerous converters 170, as shown in FIG. 1, can be replaced by a single chip in order to reduce the number of processing steps as well as to maximize the similarity in processing steps between the EO package with electrical or light output. Also, the converters 170 may be disposed further upwards in the structure, for example, between the optical guides 150 to allow the over-molding to also protect and cover the converters 170. In FIG. 1, the EO package shows the light-guiding fiber having a direct bond between primary converter 140 and optical guide 160, which tends to increase the fiber length and may reduce the manufacturing ability of the package. To avoid this potential problem, it is possible to put a layer of light-guiding material similar to light guiding medium 250 of FIG. 2 so that the light-guiding fiber channels the signal from primary converter 240 toward this layer of light-guiding material. This light-guiding material layer can guide the signal towards its final destination. In another embodiment, the substrates shown in FIGS. 1 and 2 may be formed of PCB, copper, or ceramic. A small cavity may be formed so that the IC die may sit further down into the substrate and reduce the overall height of the structure. In another alternative, some form of molding, such as a globtop material, would cover the IC die and/or the primary converters to provide a protective layer for those items (and is described below in more detail).

Adhesives are preferred for joining two or more parts together, although this invention is not thereby limited. Suitable adhesives are well known in the art and include UV-cured, thermal-set, thermal-cured, pressure-set, and pressure-cured adhesives. In addition to providing adhesion, the adhesives may also be simultaneously used to channel or allow the passage of optical signals.

Over-molding and glob-top are well known in-the art as techniques to cover and protect an integrated circuit and its wires. These two techniques are used in the present invention to protect the integrated circuits and its associated optical waveguides. FIG. 1 shows an embodiment of the present invention that uses overmolding.

The process of transmitting the signal from the IC die to a plurality of bondpads of the EO package is commonly known as fanning. By fanning optical signals, the current invention minimizes the parasitic effects. Light-guiding waveguides are used to fan the optical signals. In FIG. 1, the waveguides are optical fibers. This fiber could be made of a polymer, fused silica, or any other light-guiding material, and could be single-mode or multi-mode. At one end, the fiber is operatively associated with the primary converter to receive optical signals therefrom. The other end is operatively associated with, for example, another light-guiding medium or to the light-to-electricity converter to which the optical signal is transmitted. The attachment can be formed by welding (thermo-sonic or other methods), adhesion, or through mechanical devices, such as sockets.

Figure 9:
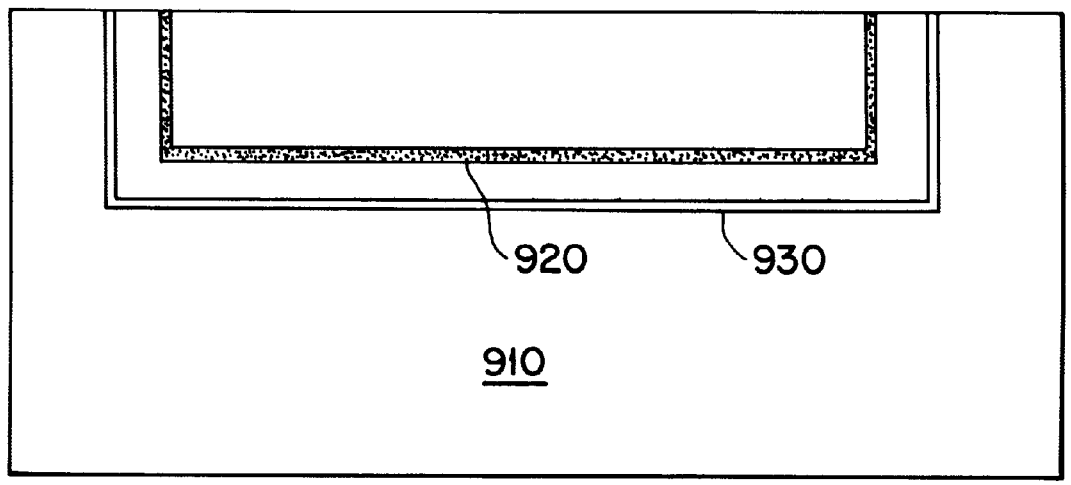
FIG. 9 shows a schematic view of the optical paths.

Another method of achieving optical signal fanning is to use a planar light-guiding medium. This light-guiding medium can form part of or the entire signal path from the primary converter onwards. One form of a planar light-guiding medium is a tape 750 within which optical paths are created. FIG. 9 shows an example of optical paths 950 disposed on a substrate 910 by adhesive 920. As shown in FIGS. 7A, 7B, 8A, and 8B, the optical paths 750 may be air-channels or optical fibers with an optically dense or a reflecting coating 850, which could also be made to simultaneously conduct electricity. Thus, both the optical and the electrical signals, such as power and ground, can be routed through one path. In addition to the tape format, the light-guiding medium can be formed with the substrate, whereby the optical paths may be formed by air-channels or by embedding light-guiding materials on top of or within the substrate.

FIGS. 7A and 7B show top and side views of one way of fanning optical signals. The light guiding medium 750 is embedded in substrate 712, which has a tape format. This substrate 712 is attached to another substrate 710 using adhesive 720. An electricity-to-light converter 740 is-disposed on top of the tape 750 by an appropriate adhesive.

FIGS. 8A and 8B show another way, of fanning optical signals. The light-guiding medium, which are optical waveguides 850, are disposed within the substrate 810. Reference numeral 840 identifies the electricity-to-light converter.

Figure 11:
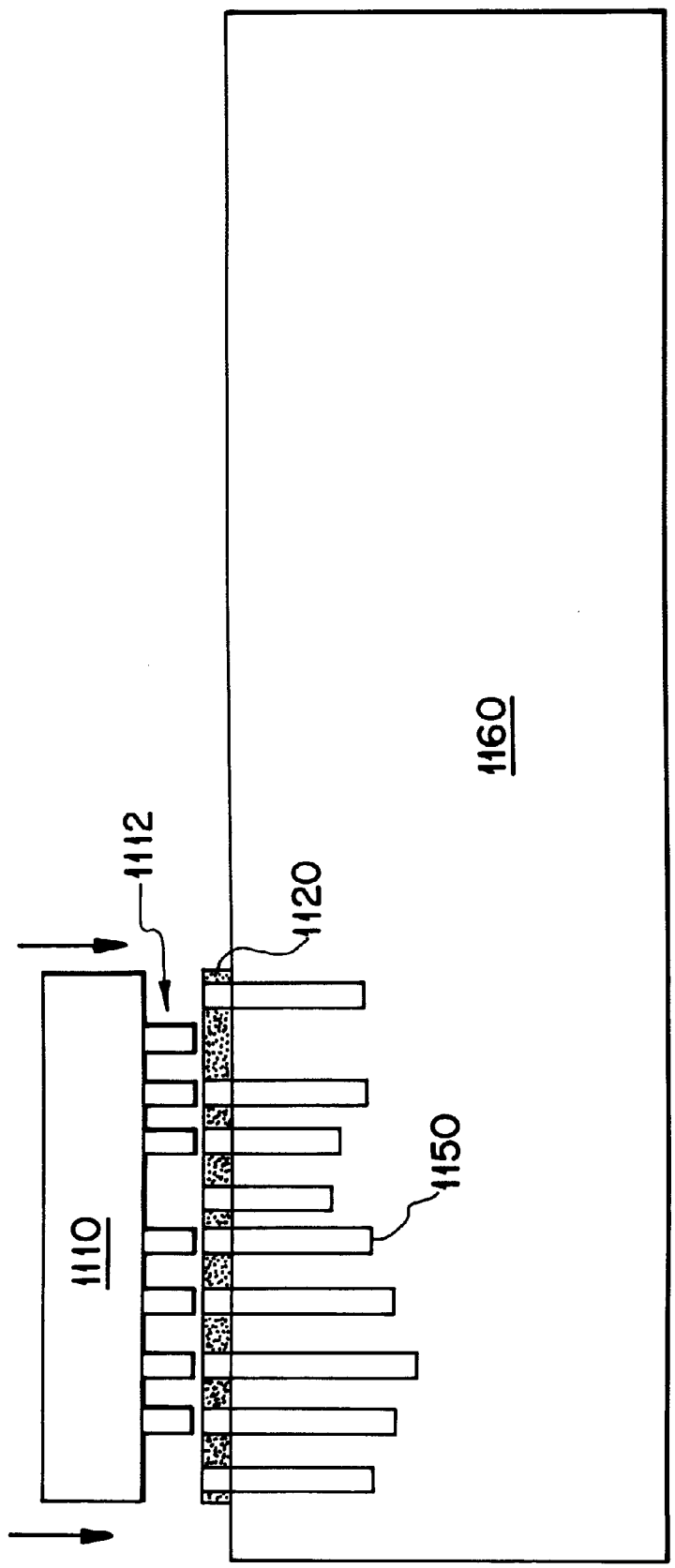
FIG. 11 shows a schematic view of the openings.

In another embodiment, the input and the output of the package can both be optical signals. In that case, a converter 170 is not necessary since the signals can exit the package through appropriate openings. One example of this is shown in FIG. 11, in which an EO package 1110 is mounted onto an optical board 1160 using a perforated adhesive 1120. Cylindrical protrusions 1112 are used to align the EO package 1110 onto the optical board 1160, and to guide the optical signals from the EO package 1110 to the optical paths 1150 in the optical board 1160. Although FIG. 11 shows the opening to take the form of a cylindrical protrusions, these openings may be a simple aperture, an aperture with a lens, an aperture with a protrusion for light-guiding or alignment purposes, or any combination thereof.

In the embodiments in which the input and output signals are electrical signals, a light-to-electricity converter is used, and the electrical signals are routed out of the package using electrical conductors. Depending on the location of the light-to-electricity converters, the electrical conductors may or may not be an integral part of the light-to-electricity converter. If the electrical conductors are an integral part of the light-to-electricity converter, the electrical conductor may be formed of any suitable material, such as solder, metals, metallic alloys, or other similar materials.

The optical waveguides can simultaneously transmit both an optical signal and electricity. Conductivity of electricity can be attained through usage of an optically and electrically conducting material or by coating the waveguides with a conducting medium, e.g., gold, silver, or similar metals, or, if an air channel is used, using an electrical conductor as the reflecting medium. Such a construction would enable production of one board to accommodate non-EO package types.

While specific embodiments and variations of the present invention have been shown and described, further modifications and improvements will occur to those skilled in the art, and are to be encompassed by the appended claims. It should be understood that this invention is not limited to the particular forms shown and/or described.

I claim:

1. An electro-optical package insertable into a motherboard of an electronic component to permit said package to receive electrical and/or optical signals from the motherboard, to convert the electrical signals into optical signals and transmit the optical signals within said package, and to emit the optical signals from said package and/or convert the optical signals back into electrical signals for emission from said package, said package comprising:
   at least one substrate;
   at least one integrated circuit die, disposed directly or indirectly on said substrate;
   at least one electricity-to-light converter operatively connected to said integrated circuit die to receive electrical signals from said integrated circuit die and convert the electrical signals into optical signals; and
   at least one optical guide constructed and arranged to receive optical signals from said converter and transmit the optical signals either outside of said package as optical signals or to a light-to-electricity converter optionally provided in said package,
   wherein said integrated circuit die, said electricity-to-light converter, and at least a portion of said optical guide are encapsulated within a resin or cured resin.

2. The electro-optical package of claim 1,wherein said package receives electrical signals from the motherboard.

3. The electro-optical package of claim 1,wherein said package receives optical signals from the motherboard.

4. The electro-optical package of claim 1,wherein said optical guide comprises a plurality of optical fibers.

5. The electro-optical package of claim 4, wherein said package includes said light-to-electricity converter, said light-to-electricity converter being disposed below said substrate and being connected to an electrical conductor for outputting electrical signals.

6. The electro-optical package of claim 4, wherein said integrated circuit die is interposed between said electricity-to-light converter and said substrate.

7. The electro-optical package of claim 4, wherein said electricity-to-light converter is interposed between said integrated circuit die and said substrate.

8. The electro-optical package of claim 4, wherein said package outputs optical signals.

9. The electro-optical package of claim 1, wherein said optical guide comprises a light guiding tape.

10. The electro-optical package of claim 9, wherein said package includes said light-to-electricity converter, said light-to-electricity converter being disposed below said substrate and being connected to an electrical conductor for outputting electrical signals.

11. The electro-optical package of claim 9, wherein said integrated circuit die is interposed between said electricity-to-light converter and said substrate.

12. The electro-optical package of claim 9, wherein said electricity-to-light converter is interposed between said integrated circuit die and said substrate.

13. The electro-optical package of claim 9, wherein said package outputs optical signals.

14. An electronic component, comprising:
   a) a motherboard;
   b) at least one board;
   c) at least one edge connector connecting said motherboard to said board; and
   d) at least one electro-optical package mounted on said board, said package comprising:
      at least one substrate;
      at least one integrated circuit die, disposed directly or indirectly on said substrate;
      at least one electricity-to-light converter operatively connected to said integrated circuit die to receive electrical signals from said integrated circuit die and convert the electrical signals into optical signals; and
      at least one optical guide constructed and arranged to receive optical signals from said converter and transmit the optical signals either outside of said package as optical signals or to a light-to-electricity converter optionally provided in said package,
      wherein said integrated circuit die, said electricity-to-light converter, and at least a portion of said optical guide are encapsulated within a resin or cured resin.

15. The electro-optical package of claim 14, wherein said optical guide comprises a plurality of optical fibers.

16. The electro-optical package of claim 15, wherein said package includes said light-to-electricity converter, said light-to-electricity converter being disposed below said substrate and being connected to an electrical conductor for outputting electrical signals.

17. The electro-optical package of claim 15, wherein said integrated circuit die is interposed between said electricity-to-light converter and said substrate.

18. The electro-optical package of claim 15, wherein said electricity-to-light converter is interposed between said integrated circuit die and said substrate.

19. The electro-optical package of claim 15, wherein said package outputs optical signals.

20. The electro-optical package of claim 14, wherein said optical guide comprises a light guiding tape.

21. The electro-optical package of claim 20, wherein said package includes said light-to-electricity converter, said light-to-electricity converter being disposed below said substrate and being connected to an electrical conductor for outputting electrical signals.

22. The electro-optical package of claim 20, wherein said integrated circuit die is interposed between said electricity-to-light converter and said substrate.

23. The electro-optical package of claim 20, wherein said electricity-to-light converter is interposed between said integrated circuit die and said substrate.

24. The electro-optical package of claim 20, wherein said package outputs optical signals.

25. An optical board which is connectable to a motherboard and on which one or more EO packages are mountable thereon to permit said EO packages to optically interact with each other, said optical board comprising:

an edge connector constructed and arranged to connect and communicate said optical board to the motherboard;

an optical guiding medium disposed on said optical board, said optical guiding medium being constructed and arranged both to permit optical signals to be delivered from the motherboard to the EO packages for processing and to permit processed optical signals to be returned to the motherboard from the EO packages.

26. The optical board according to claim 25, wherein at least one electrical package is mountable on said optical board, and further wherein said optical board further comprises at least one electrical trace arranged to permit electrical signals to be received from the EO packages and to permit electrical signals to be returned to the EO packages.

27. The optical board according to claim 25, wherein said optical guiding medium is an optically-reflecting cavity.

28. The optical board according to claim 25, wherein said optical guiding medium is a plurality of light guiding traces, said light guiding traces being adapted to guide light and/or conduct electricity, separately or simultaneously.

29. The optical board according to claim 28, wherein each said light guiding trace is an air-channel.

30. The optical board according to claim 28, wherein each said light guiding trace is formed of an optically guiding material in the shape of a rectangular. cavity, or a fiber.

31. An optical board assembly which is connectable to a motherboard, said optical board assembly comprising:

one or more EO packages mountable on said optical board to permit said EO packages to optically interact with each other; and an optical board comprising:

an edge connector constructed and arranged to connect and communicate said optical board to the motherboard;

an optical guiding medium disposed on said optical board, said optical guiding medium being constructed and arranged both to permit optical signals to be delivered from the motherboard to said EO packages for processing and to permit processed optical signals to be returned to the motherboard from said EO packages.

32. The optical board according to claim 31, wherein at least one electrical package is mountable on said optical board, and further wherein said optical board further comprises at least one electrical trace arranged to permit electrical signals to be received from said EO packages and to permit electrical signals to be returned to said EO packages.

33. The optical board according to claim 31, wherein said optical guiding medium is an optically-reflecting cavity.

34. The optical board according to claim 31, wherein said optical guiding medium is a plurality of light guiding traces, said light guiding traces being adapted to guide light and/or conduct electricity, separately or simultaneously.

35. The optical board according to claim 34, wherein each said light guiding trace is an air-channel.

36. The optical board according to claim 34, wherein each said light guiding trace is formed of an optically guiding material in the shape of a rectangular cavity or a fiber.

* * * * *

UNITED STATES PATENT AND TRADEMARK OFFICE
CERTIFICATE OF CORRECTION

PATENT NO. : 6,301,401 B1
DATED : October 9, 2001
INVENTOR(S) : Hoang-Phong La

It is certified that error appears in the above-identified patent and that said Letters Patent is hereby corrected as shown below:

Column 2,
Lines 55-57, replace "manufacturing with dies having area-arrayed I/O pads as the optical waveguiding fibers. The area arrayed I/O pads can contact each other without shorting." with -- manufacturing with dies having area-arrayed I/O pads, as the optical waveguided fibers can contact each other without shorting. --

Column 3,
Line 54, replace "guiding material portion 150" with -- guiding material portion 160 --.

Column 4,
Line 7, repalce "A separate path for power and ground to the electro-optic" with -- Aseparate path is provided for power and ground to th electro-optic --.
Line 56, replace "In the first embodiment" with -- In this embodiment --.

Column 8,
Line 24, replace "optical path 950" with -- optical path 930 --.

Signed and Sealed this

Eighteenth Day of June, 2002

Attest:

Attesting Officer

JAMES E. ROGAN
*Director of the United States Patent and Trademark Office*